United States Patent
Im

(10) Patent No.: US 7,973,347 B2
(45) Date of Patent: Jul. 5, 2011

(54) COMPLEMENTARY METAL OXIDE SILICON IMAGE SENSOR AND METHOD OF FABRICATING THE SAME

(75) Inventor: Ki Sik Im, Daegu-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 12/696,575

(22) Filed: Jan. 29, 2010

(65) Prior Publication Data

US 2010/0133421 A1 Jun. 3, 2010

Related U.S. Application Data

(62) Division of application No. 11/646,644, filed on Dec. 27, 2006, now Pat. No. 7,670,868.

(30) Foreign Application Priority Data

Dec. 30, 2005 (KR) .................. 10-2005-0134772

(51) Int. Cl.
*H01L 31/062* (2006.01)
(52) U.S. Cl. ........................ 257/294; 257/432
(58) Field of Classification Search .................. 257/292, 257/294, 432
See application file for complete search history.

(56) References Cited

U.S. PATENT DOCUMENTS

| | | | |
|---|---|---|---|
| 4,986,878 A | 1/1991 | Malazgirt et al. | |
| 7,019,373 B2 * | 3/2006 | Hashimoto | 257/432 |
| 7,262,448 B2 * | 8/2007 | Kim | 257/294 |
| 7,358,110 B2 * | 4/2008 | Kim | 438/69 |
| 7,670,868 B2 * | 3/2010 | Im | 438/70 |
| 2005/0242271 A1 | 11/2005 | Weng et al. | |

* cited by examiner

*Primary Examiner* — Mark Prenty
(74) *Attorney, Agent, or Firm* — The Law Offices of Andrew D. Fortney; Andrew D. Fortney; William K. Nelson

(57) ABSTRACT

Disclosed is a method of fabricating a CMOS (Complementary Metal Oxide Silicon) image sensor. The method includes the steps of: forming a device protective layer and a metal interconnection on a substrate formed with a light receiving device; forming an inner micro-lens on the metal interconnection; coating an interlayer dielectric layer on the inner micro-lens and then forming a color filter; and forming an outer micro-lens including a planarization layer and photoresist on the color filter. The inner micro-lens is formed by depositing the outer layer on dome-shaped photoresist. The curvature radius of the inner micro-lens is precisely and uniformly maintained and the inner micro-lens is easily formed while improving the light efficiency. Since the fabrication process for the CMOS image sensor is simplified, the product yield is improved and the manufacturing cost is reduced.

17 Claims, 6 Drawing Sheets

COMPLEMENTARY METAL OXIDE SILICON IMAGE SENSOR AND METHOD OF FABRICATING THE SAME

The present application is a divisional application of U.S. patent application Ser. No. 11/646,644, filed Dec. 27, 2006, now U.S. Pat. No. 7,670,868, which is incorporated herein by reference in its entirety.

BACKGROUND OF THE INVENTION

1. Field of the Invention

The present invention relates to a method of fabricating a semiconductor device. More particularly, the present invention relates to a method of fabricating a CMOS (Complementary Metal Oxide Silicon) image sensor including an inner micro-lens.

2. Description of Related Art

A method of fabricating a CMOS image sensor according to a related art is shown in FIGS. 1A to 1G. FIGS. 1A to 1E show the procedure for forming an outer micro-lens on a substrate having a logic block, a light receiving device, etc.

FIG. 1A shows a device protective layer 120 coated on a substrate 100 formed with a light receiving device 110, such as a photodiode. Then, referring to FIG. 1B, after coating an aluminum metal layer (not shown), an aluminum interconnection 130 is formed through photo and etching processes, and then an interlayer dielectric layer 140 is coated thereon.

After that, referring to FIG. 1C, a $Si_3N_4$ layer or a $SiO_2$ layer 150 is deposited to form an inner micro-lens. In addition, although not shown in FIG. 1C, photoresist is coated on the $Si_3N_4$ layer or the $SiO_2$ layer 150. Then, a thermal reflow process is performed to form a dome shape.

Then, an anisotropic etching process is performed in the vertical direction until the photoresist as well as a predetermined portion of the $Si_3N_4$ layer or the $SiO_2$ layer 150, in which the photoresist is not formed, have been completely removed. Thus, as shown in FIG. 1D, a dome-shaped inner micro-lens 155 including $Si_3N_4$ or $SiO_2$ is formed.

In addition, as shown in FIG. 1E, an oxide layer 160 is formed on the inner micro-lens 155. Then, a color filter 170 and a planarization layer 180 are formed on the oxide layer 160.

Finally, as shown in FIG. 1G, an outer micro-lens 190 is formed on the planarization layer 180 through a photo process.

According to the CMOS image sensor having the above structure, the light focusing function of the micro-lens may exert an influence upon the quality of the image sensor. In order to effectively focus the light, the curvature of the micro-lens must be uniformly formed such that the light can be constantly focused onto the light receiving device. However, the above-mentioned conventional CMOS image sensor employs the inner micro-lens, which is formed through the anisotropic etching process instead of the photo process, it is very difficult to uniformly set the curvature of the inner micro-lens. In addition, the process of forming the inner micro-lens is very complicated. Accordingly, the product yield is lowered and the manufacturing cost for the CMOS image sensor may rise.

SUMMARY OF THE INVENTION

An object of the present invention is to provide a method of fabricating a CMOS image sensor, capable of precisely and uniformly forming a curvature radius of an inner micro-lens used in the CMOS image sensor while effectively focusing light. Another object of the present invention is to provide a method of fabricating a CMOS image sensor, capable of simplifying fabrication processes for an inner micro-lens while improving the product yield of the CMOS image sensor and reducing the manufacturing cost thereof.

In order to accomplish the above objects, In order to accomplish the above objects, the present invention provides a method of fabricating a CMOS image sensor, the method comprising the steps of: forming a device protective layer on a substrate formed with a light receiving device; forming a metal interconnection on the device protective layer; forming an inner micro-lens on the metal interconnection and coating an oxide layer on the inner micro-lens; forming a color filter on the oxide layer through a photo process; and forming a planarization layer on the color filter, and then forming an outer micro-lens through photo and heat-treatment processes. The inner micro-lens is formed by performing the steps of forming dome-shaped photoresist (PR) through photo and heat-treatment processes and depositing an outer layer on the dome-shaped PR. The outer layer includes $Si_3N_4$ or $SiO_2$. The outer layer including $Si_3N_4$ is deposited through a low temperature chemical vapor deposition (LTCVD) scheme, and the outer layer including $SiO_2$ is deposited through a low temperature deposition of oxide (LTO) scheme. In addition, the present invention also provides a method of fabricating a CMOS image sensor, the method comprising the steps of: coating a device protective layer on a substrate formed with a light receiving device; coating an aluminum layer on the device protective layer and then selectively etching the aluminum layer, thereby forming a metal interconnection; coating an interlayer dielectric layer on the metal interconnection; coating photoresist (PR) on the interlayer dielectric layer, forming dome-shaped PR through photo and heat-treatment processes, and then depositing an outer layer, thereby forming an inner micro-lens; coating an oxide layer on the inner micro-lens; forming a color filter on the oxide layer through a photo process; forming a planarization layer on the color filter; and coating PR on the planarization layer, and then forming an outer micro-lens through photo and heat-treatment processes. The outer layer includes $Si_3N_4$ or $SiO_2$. The outer layer including $Si_3N_4$ is deposited through a low temperature chemical vapor deposition (LTCVD) scheme, and the outer layer including $SiO_2$ is deposited through a low temperature deposition of oxide (LTO) scheme.

DETAILED DESCRIPTION OF THE INVENTION

Hereinafter, a method of fabricating a CMOS image sensor according to an embodiment of the present invention will be described with reference to FIGS. 2A to 2F. In FIGS. 1A to 2F, only one pixel area of the CMOS image sensor is shown.

Figure 1A:
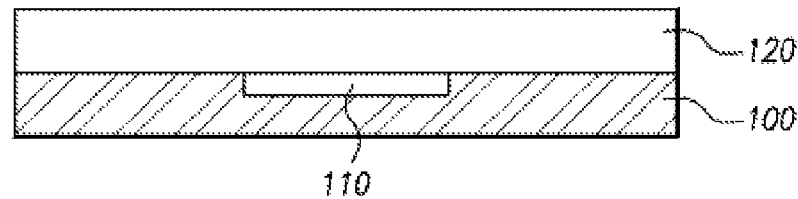
FIGS. 1A to 1G are sectional views illustrating a method of fabricating a CMOS image sensor according to the related art.
Figure 1B:
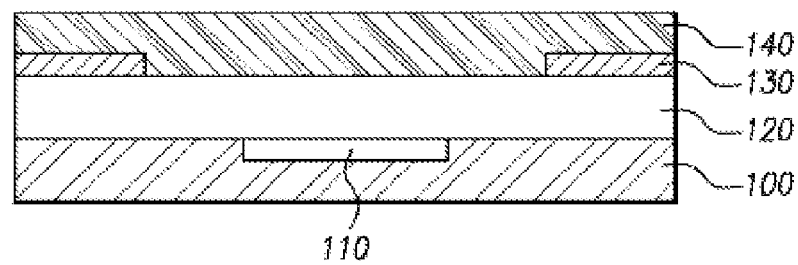
Figure 1C:
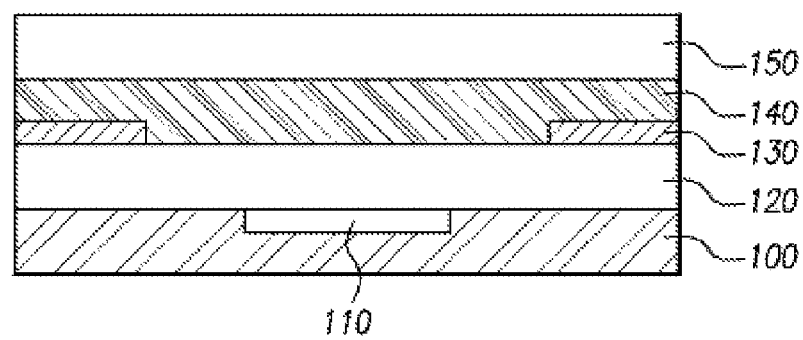
Figure 1D:
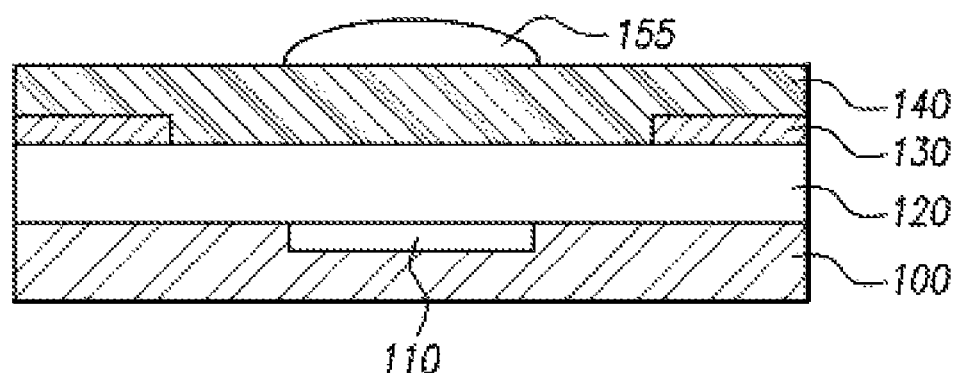
Figure 1E:
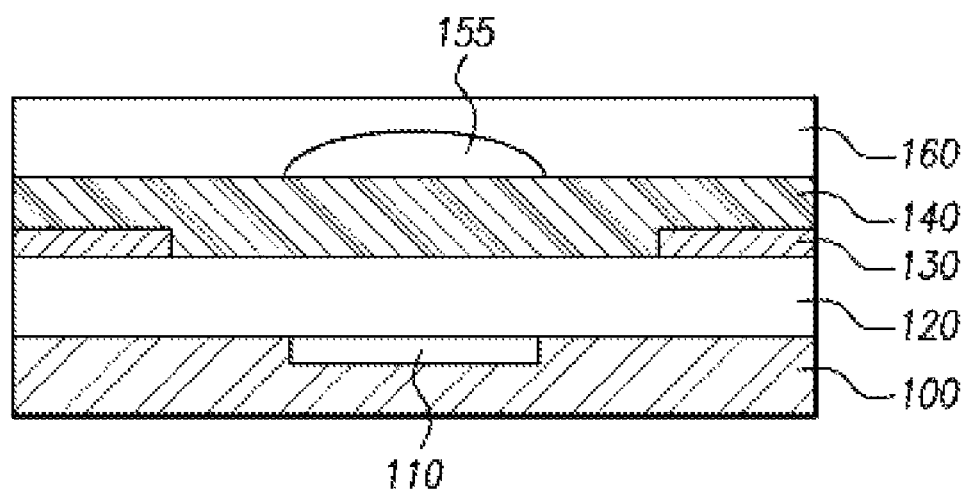
Figure 1F:
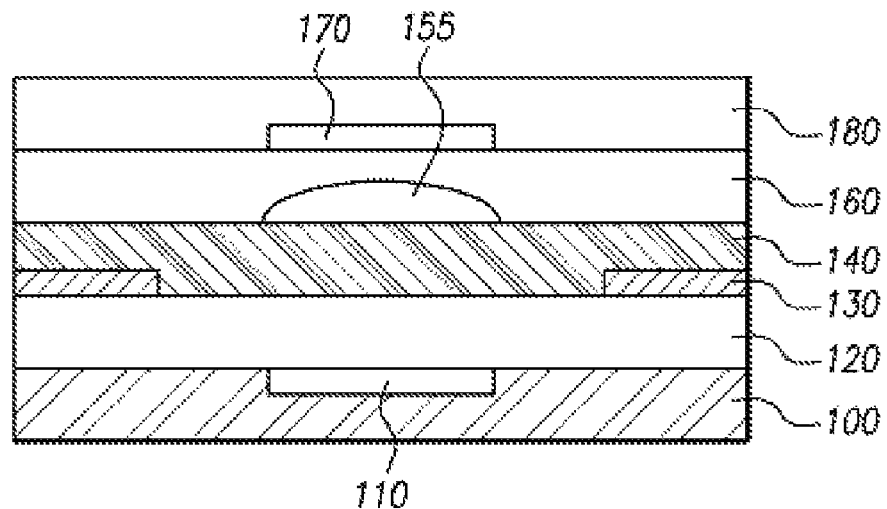
Figure 1G:
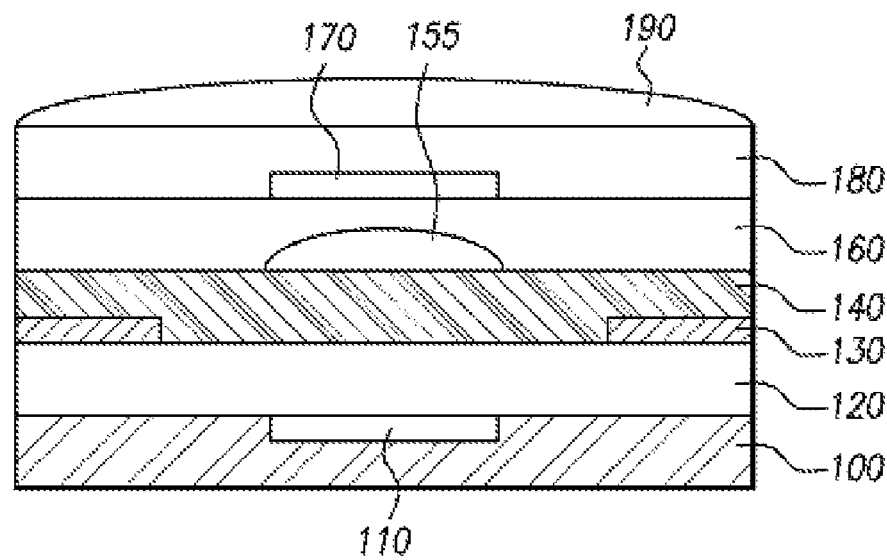
Figure 2A:
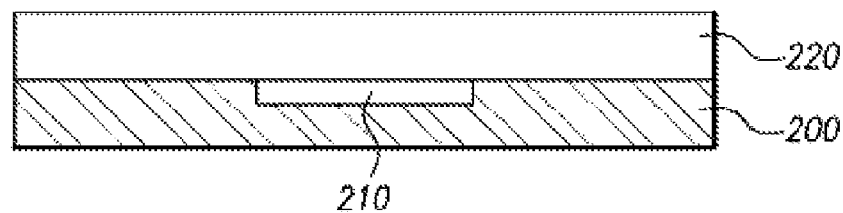
FIGS. 2A to 2F are sectional views illustrating a method of fabricating a CMOS image sensor according to an embodiment of the present invention.

Referring to FIG. 2A, a device protective layer 220 is formed on a substrate 200 in which a logic circuit is formed in a logic block and a light receiving device 210, such as a photodiode, is formed in a pixel block. The device protective layer 220 is an oxide layer, such as a $SiO_2$ layer.

Figure 2B:
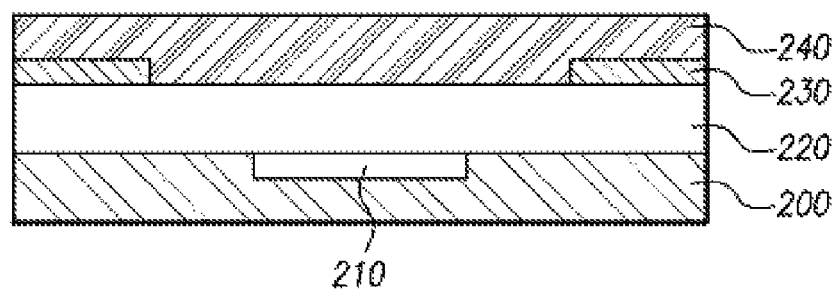

Referring to FIG. 2B, a metal interconnection is formed on the device protective layer 220. After coating an aluminum metal layer (not shown), a metal interconnection 230 and an interlayer dielectric layer 240 are formed through photo and etching processes. Such a metal interconnection can be fabricated by using aluminum. However, a copper interconnection can be fabricated through a damascene process, if necessary.

Figure 2C:
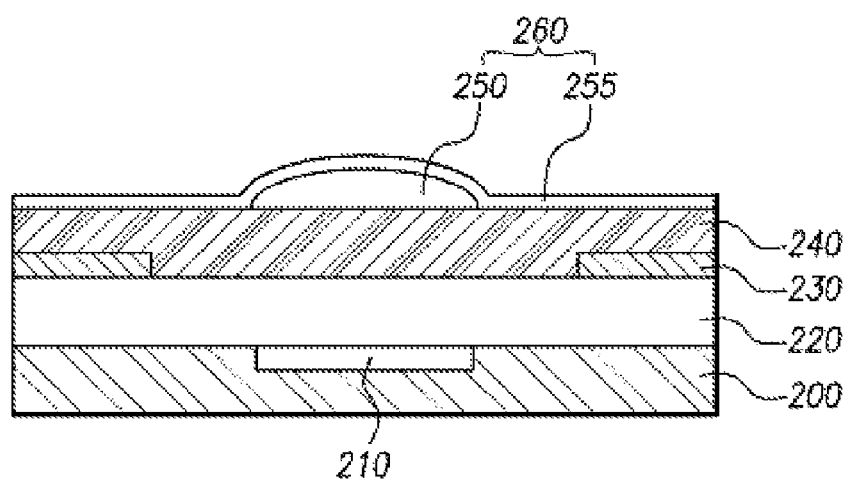

As shown in FIG. 2C, different from the related art, a photoresist layer (not shown) is formed on the interlayer dielectric layer and dome-shaped photoresist (PR) 250 is formed through photo and heat-treatment processes. Then, a thin outer layer 255 is deposited on the dome-shaped PR 250, thereby forming an inner micro-lens 260. Here, the PR for the inner micro-lens 260 is identical to PR for an outer micro-lens which will be formed later. Since the dome-shape photoresist is formed through the photo and heat-treatment processes, the curvature radius of the inner micro-lens 260 can be uniformly and precisely maintained. The curvature radius can be adjusted according to the temperature, time, etc. of the heat-treatment process.

In addition, the outer layer 255 has functions of maintaining and protecting the dome-shaped PR 250 and includes $Si_3N_4$ or $SiO_2$. If the outer layer 255 includes $Si_3N_4$, the outer layer 255 is preferably deposited through a low temperature chemical vapor deposition (LTCVD) scheme. In addition, if the outer layer 255 includes $SiO_2$, the outer layer 255 is preferably deposited through a low temperature deposition of oxide (LTO) scheme. The LTCVD scheme is performed at a pressure lower than a normal pressure based on diffusion caused by chemical reaction. The LTO scheme deposits the oxide layer at the relatively low temperature of about 400° C. to 450° C. while using the LTCVD scheme. The above deposition schemes are employed so as to protect the dome-shaped PR 250 under the high temperature condition. In addition, the outer layer including $Si_3N_4$ or $SiO_2$ used for the conventional inner micro-lens is shallowly formed on the dome-shaped PR 250, thereby minimizing interfacial reflectance.

As the CMOS image sensor is fabricated in a micro-size, photo charges generated from each pixel area may penetrate into adjacent pixel area, thereby causing cross-talk. The inner micro-lens 260 is used for preventing the cross-talk that interrupts the image reproduction. Thus, the light incident into the light receiving device 210 must be vertically induced through the inner micro-lens 260.

As mentioned above, different from the related art requiring complicated processes, such as the photo process, the etching process, the heat-treatment process, etc., the present invention simply includes the photo process and the heat-treatment process.

Figure 2D:
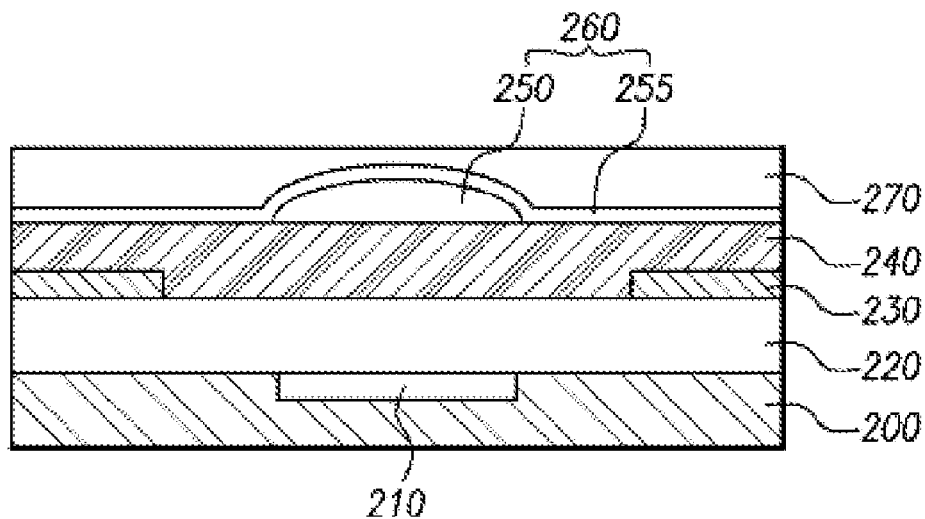

Then, referring to FIG. 2D, an oxide layer 270 is coated on the inner micro-lens 260. The oxide layer 270 is used for protecting the inner micro-lens 260.

Figure 2E:
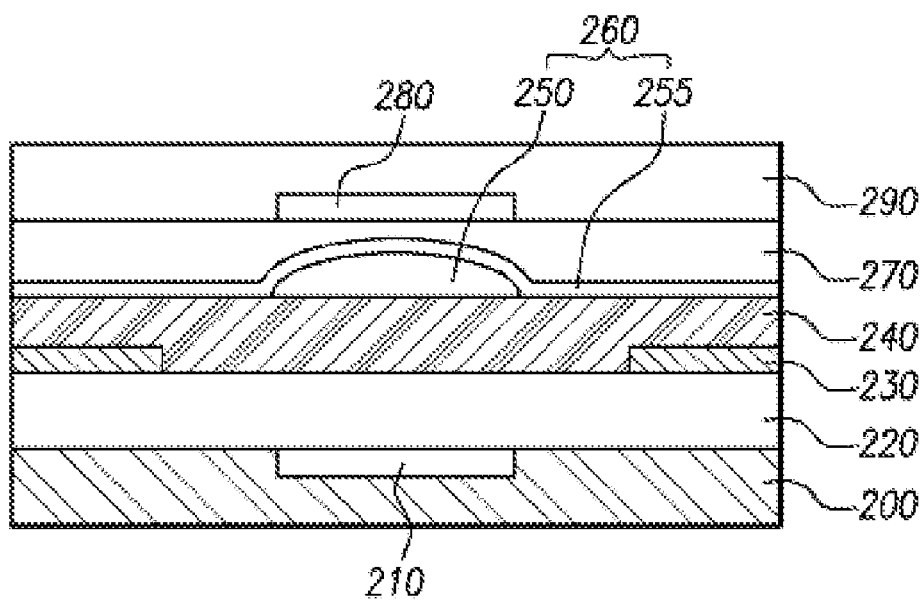
Figure 2F:
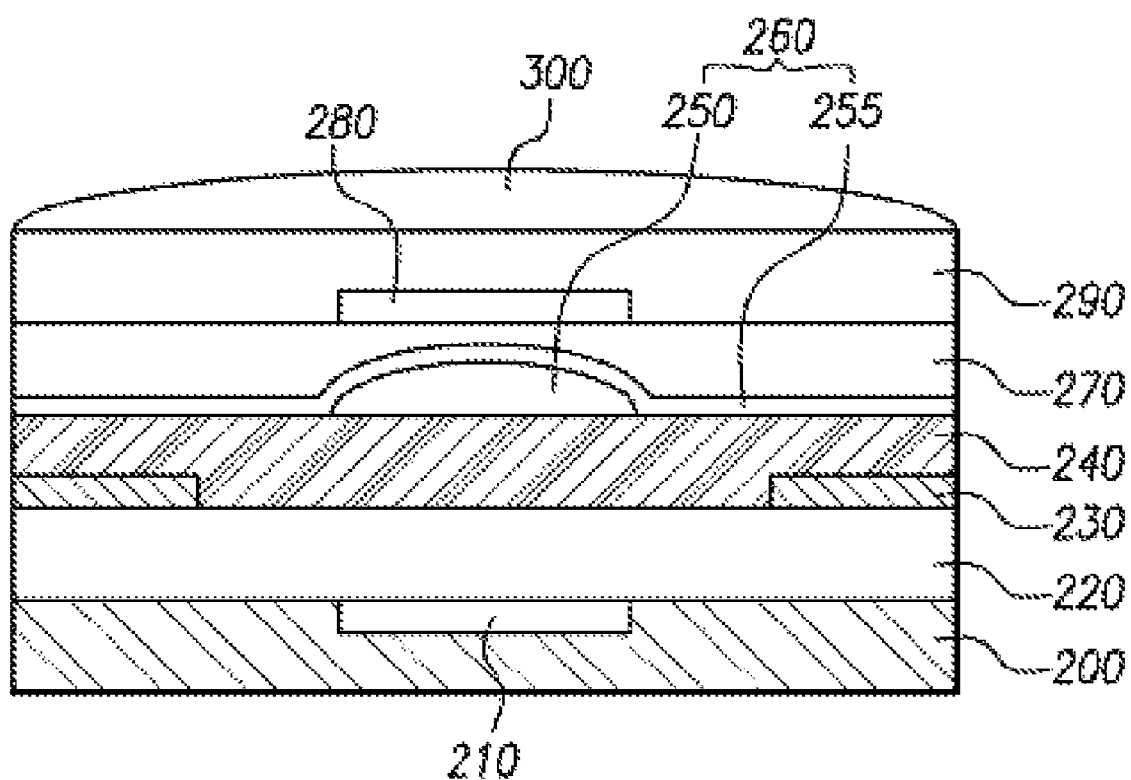

As shown in FIGS. 2E and 2F, the subsequent processes are identical to those of the conventional CMOS image sensor fabrication process. Referring to FIG. 2E, a color filter 280 is formed through a photo process and then a planarization layer 290 is formed thereon. After that, as shown in FIG. 2F, a PR layer (not shown) is coated on the planarization layer 290 and a micro-lens 300 is formed through photo and heat-treatment processes.

In this manner, the inner micro-lens of the CMOS image sensor can be precisely and easily fabricated, so that the product yield is improved and the manufacturing cost is reduced.

According to the present invention, the inner micro-lens of the CMOS image sensor is formed by heat-treating the PR layer, so that the curvature radius of the inner micro-lens can be precisely and uniformly maintained and the inner micro-lens is easily formed while improving the light efficiency. In addition, since the fabrication process for the CMOS image sensor can be simplified, the product yield is improved and the manufacturing cost is reduced.

The invention claimed is:

1. A CMOS image sensor, comprising:
    a substrate having a light receiving layer thereon;
    a protective layer on the substrate, including the light receiving layer;
    a metal interconnection on the protective layer;
    a dielectric layer on or over the metal interconnection;
    a first micro-lens on or over the dielectric layer;
    an oxide layer on the micro-lens;
    a color filter on the oxide layer, over the first micro-lens;
    a planarization layer on the color filter; and
    a second micro-lens on the planarization layer, such that the color filter is positioned between the first micro-lens and the second micro-lens.

2. The CMOS image sensor as claimed in claim 1, wherein each of the first and second micro-lenses comprises a dome-shaped or convex photoresist (PR).

3. The CMOS image sensor as claimed in claim 2, wherein the second micro-lens has a contact area with the planarization layer that is greater than a corresponding contact area between the first micro-lens and the dielectric layer.

4. The CMOS image sensor as claimed in claim 1, wherein the first micro-lens comprises a dome-shaped photoresist and a conformal outer layer on the dome-shaped photoresist.

5. The CMOS image sensor as claimed in claim 4, wherein the conformal outer layer includes $Si_3N_4$ or $SiO_2$.

6. The CMOS image sensor as claimed in claim 4, wherein the oxide layer is planar.

7. The CMOS image sensor as claimed in claim 1, wherein the second micro-lens is formed over the first micro-lens.

8. The CMOS image sensor as claimed in claim 7, wherein the first micro-lens is over the light receiving layer.

9. The CMOS image sensor as claimed in claim 1, wherein the metal interconnection comprises a first portion and a second portion, and each of the first portion and the second portion are on the protective layer.

10. The CMOS image sensor as claimed in claim 9, wherein the first micro-lens is over a gap between the first and second portions of the metal interconnection.

11. The CMOS image sensor as claimed in claim 1, wherein the substrate includes a pixel block containing the light receiving layer and a logic block containing a logic circuit.

12. The CMOS image sensor as claimed in claim 1, wherein the protective layer comprises an oxide layer.

13. The CMOS image sensor as claimed in claim 12, wherein the oxide layer is a $SiO_2$ layer.

14. The CMOS image sensor as claimed in claim 1, wherein the metal interconnection comprises aluminum.

15. The CMOS image sensor as claimed in claim 1, wherein the metal interconnection comprises copper.

16. The CMOS image sensor as claimed in claim 5, wherein the conformal outer layer includes a low temperature oxide.

17. The CMOS image sensor as claimed in claim 5, wherein the conformal outer layer includes $Si_3N_4$.

* * * * *